United States Patent [19]

Stock et al.

[11] Patent Number: 4,834,832

[45] Date of Patent: May 30, 1989

[54] PROCESS AND APPARATUS FOR THE MANUFACTURE OF SILICON RODS

[75] Inventors: Horst Stock; Lothar Huber, both of Burghausen, Fed. Rep. of Germany; Georg Priewasser, Ach, Austria

[73] Assignee: Wacker-Chemitronic Gesellschaft fur Elektronik-Grundstoffe mbH, Burghausen, Fed. Rep. of Germany

[21] Appl. No.: 896,501

[22] Filed: Aug. 15, 1986

[30] Foreign Application Priority Data

Sep. 4, 1985 [DE] Fed. Rep. of Germany ....... 3531610

[51] Int. Cl.$^4$ .................. C30B 15/08; C30B 27/02
[52] U.S. Cl. .................. 156/620.1; 156/616.4; 156/620.4; 156/DIG. 96; 156/DIG. 98; 422/246; 422/249
[58] Field of Search ........... 156/608, 617 V, DIG. 88, 156/617 SP, DIG. 96, DIG. 98, 620.1, 616.4, 620.4; 422/246, 249, 253, 254; 164/428, 480, 429; 264/310; 29/33 C

[56] References Cited

U.S. PATENT DOCUMENTS

| 406,947 | 7/1889 | Norton et al. ................. 29/33 C |
| 4,108,714 | 8/1978 | Keller et al. ................. 156/617 SP |
| 4,207,293 | 6/1980 | Scholl et al. ................. 422/249 |
| 4,312,700 | 1/1982 | Helmreich et al. ............ 156/616 R |
| 4,579,168 | 4/1986 | Singer ........................ 164/428 |

FOREIGN PATENT DOCUMENTS 0730743 1/1943 Fed. Rep. of Germany ...... 164/428

Primary Examiner—Robert L. Stoll
Assistant Examiner—R. Bruce Breneman
Attorney, Agent, or Firm—Collard, Roe & Galgano

[57] ABSTRACT

A process and apparatus for the manufacture of silicon rods having a columnar structure comprising monocrystalline crystal zones with a crystallographic preferred orientation. Molten silicon is transferred from a silicon reservoir into a crystallization chamber which is formed by rollers arranged in a leak-proof manner in the shape of the desired rod cross-section. There the silicon first forms a stable outer shell of solidified material and, while it continues to crystallize, it is withdrawn at the bottom and released by the rollers. Owing to the short period of contact with a vessel wall a silicon rod is obtained that is particularly free of impurites.

23 Claims, 1 Drawing Sheet

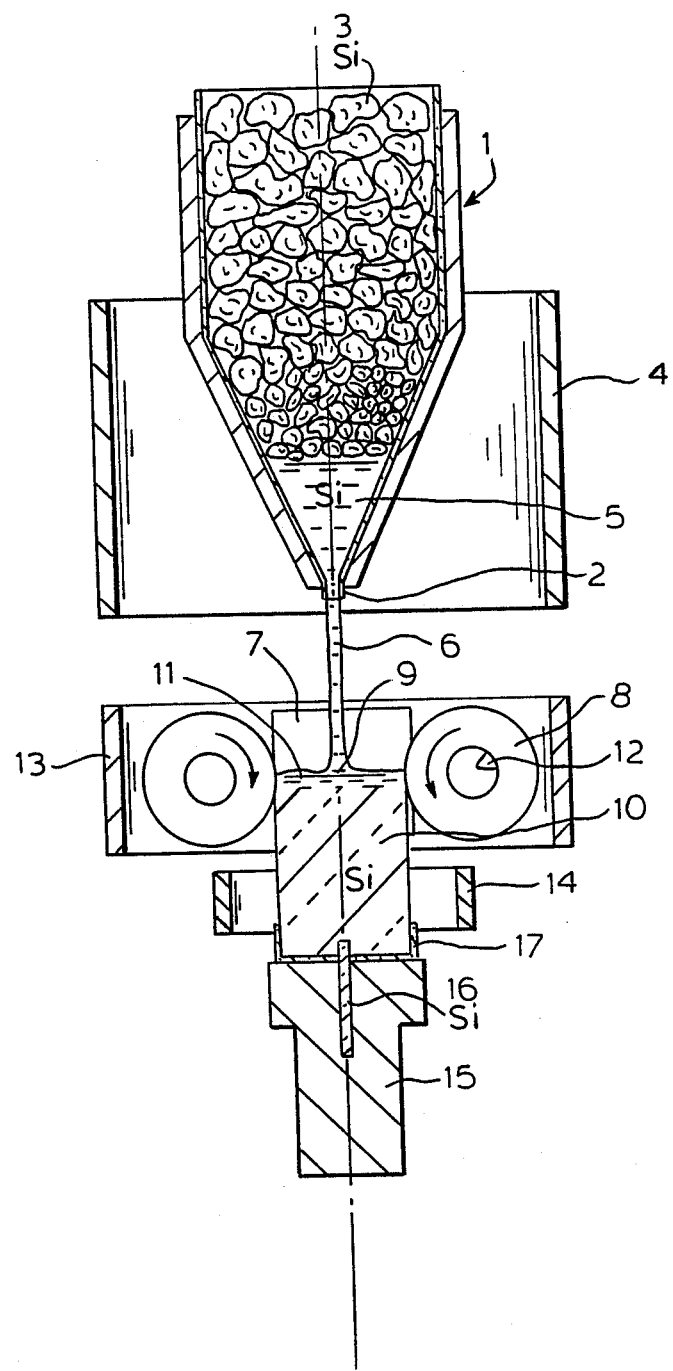

PROCESS AND APPARATUS FOR THE MANUFACTURE OF SILICON RODS

BACKGROUND OF THE INVENTION

The invention relates to a process and apparatus for the manufacture of silicon rods having a columnar structure comprising monocrystalline crystal zones with a crystallographic preferred orientation. More particularly, it relates to such a process and apparatus wherein molten silicon is transferred in a continuous or non-continuous manner from a silicon reservoir to a crystallization chamber wherein controlled solidification of the silicon occurs while maintaining a supernatant pool of molten material and with the solidified silicon being withdrawn by means of a downwardly movable support.

In this process, which is known from U.S. Pat. No. 4,312,700, there is, however, close and long contact between the pool of molten material or the solidifying silicon and the adjacent vessel wall, which is generally made of graphite, and optionally includes a thin layer of a protective melt which has been applied to the vessel. This contact results in a concentration of undesired impurities, such as, for example, carbon, in the edge zone of the silicon rod that has been withdrawn. The resulting contaminated material is of a lower quality than material that is free of impurities and, therefore, solar cells produced therefrom, for example, have a distinctly reduced efficiency. Hence, it is often necessary to remove the contaminated edge zones of the silicon rod in order to obtain a solar cell base material that meets the specified requirements.

Accordingly, it is an object of the invention to provide a process and apparatus for producing silicon rods that are especially suitable as solar cell base material and are of higher purity and quality than previously obtained according to the prior art.

SUMMARY OF THE INVENTION

The foregoing and related objects are readily attained in a process according to the present invention wherein molten silicon is transferred to a crystallization chamber in which the pool of molten material is surrounded in a leak-proof manner by rollers that are arranged to produce the shape of the desired rod cross-section. The rollers can be rotated in the withdrawal direction and are made, at least on the surface that comes into contact with molten silicon, of a material that is substantially inert towards molten silicon. The rollers enclose the molten silicon in such a manner as to shape it, and release it only after at least a stable solidified outer shell or skin has been formed.

According to this process, it is especially possible to manufacture silicon rods having a square or rectangular cross-section, although other rod cross-sections, for example, prism-like or polygon-like sections, e.g., hexagonal rod cross-sections are, in principle, not excluded. Particularly suitable are square rod cross-sections with edge lengths of approximately 100 mm or approximately 200 mm, or rectangular rod cross-sections having edge lengths of approximately 100 and approximately 200 mm. From these rods, it is possible, either directly or after separation into sub-blocks, to saw off, for example, square wafers measuring $100 \times 100$ mm and having the desired thickness, generally from 300 to 500 μm, and to process them further to form solar cells. Other lateral lengths are, in principle, not excluded.

The crystallization chamber is formed by rollers that are arranged in a plane so that the desired rod cross-section is determined by the passageway they surround. In this arrangement, the corner areas where adjacent rollers abut one another have special importance. Here, the danger of the molten silicon in the crystallization chamber flowing out, on the one hand, and the danger of the undesired formation of loose particles of abraded material, on the other hand, are particularly great. The rollers are therefore preferably arranged with respect to one another in such a manner that, although they can be rotated freely and independently of one another, the distance between them at the narrowest point is kept as small as possible. Experience has shown that the high surface tension of the molten silicon ensures that the crystallization chamber is leakproof at the narrowest point of the passageway up to a value of approximately 0.5 mm, i.e., no silicon can escape at this point. It has proved to be especially favorable if the rollers overlap in the edge zone, advantageously over a length of approximately from 0.5 to 5 mm. It is, however, also possible, in principle, to arrange the rollers so that they are in contact with one another.

Suitable materials for the surfaces of the rollers that come into contact with molten silicon are those materials that are substantially inert towards molten silicon. In other words, materials which are not attacked or are difficult to attack under the process conditions, and which do not contaminate the silicon in an unacceptable manner are suitable roller contact surface materials. Such materials are, for example, certain types of graphite that have been rendered inert, e.g., by densification by pyrolytic coating within the pores, glassy carbon, quartz or reaction-bonded or hot-pressed silicon nitride or silicon carbide. The rollers can be made entirely of the mentioned materials. However, in many cases, it is also possible to provide a basic roller body made of other materials, such as graphite that has not been rendered inert, refined steel, or copper, with a coating. In general, the use of graphite has proved to be advantageous, for example, in a form that has been made non-porous by impregnation with an organic compound and subsequent decomposition of the organic compound to form carbon, or in a form coated with silicon carbide and/or silicon nitride. Coating with quartz can be achieved, for example, in a simple manner by winding a quartz band around the rollers.

The length of the rollers depends on the particular rod cross-section desired. It therefore corresponds substantially to the particular lateral or edge length of the rod, which length is optionally extended by the overlapping section. Experience has shown that the increase in volume of approximately 10% which occurs when silicon solidifies affects the cross-section of the rod less than the center of the rod, since the solidification front generally starts from the side walls and moves inwardly. The diameter of the rollers is advantageously in the range of from 50 to 200 mm, preferably from 80 to 120 mm. In this range, the outer surfaces of the rollers have a curvature that ensures that the supernatant pool of molten material is reliably enclosed, and also prevents the solidified silicon from becoming jammed at the narrowest point of the passageway. Although larger and smaller roller diameters are, in principle, not excluded, they require that the height of the xelt and the position of the pool of molten material and the crystallization front with respect to the passageway be maintained very accurately, which is an expensive operation.

In order to control the temperature of the pool of molten material and its solidification behavior, it has proved advantageous to provide means of regulating the temperature of the rollers. For example, a suitable cooling medium, e.g., a cooling gas, such as argon, can be passed through the rollers in order to maintain the roller outer surfaces at a temperature below the melting point of the silicon, especially when the crystallization process occurs over a relatively long time. In the initial phase of rod manufacture, however, it is often advantageous to preheat the rollers using a preferably external heating device, for example, by radiant heating. A surface temperature of the rollers above 1000° C., preferably above 1350° C. and below the melting temperature of the silicon, has generally proved to be favorable.

Other objects and features of the present invention will become apparent from the following detailed description considered in connection with the accompanying drawing which discloses a single embodiment of the invention. It should be understood that the drawing is designed for the purpose of illustration only, and not as a definition of the limits of the invention.

BRIEF DESCRIPTION OF THE DRAWING

The drawing is a diagramatically-illustrated sectional view of an apparatus for carrying out the process of the invention.

DETAILED DESCRIPTION OF THE PREFERRED EMBODIMENT

Turning now in detail to the appended drawing, therein illustrated is a novel apparatus for the manufacture of silicon rods, wherein silicon 3 in suitable polycrystalline form, for example, in lump form, is placed, optionally with the addition of doping substances, in a silicon reservoir 1 which may be, for example, in the form of a melting crucible having a funnel-shaped lower portion which ends in an outlet opening 2. Using a heating zone 4 which can be produced, for example, by means of resistance, inductive or electron beam heating, the silicon is heated and melted in the lower area of the crucible, and collects in the form of a melt 5 above outlet opening 2. With this arrangement, the amount of molten silicon produced can be controlled in a simple manner by increasing or reducing the heat supplied. The advantage of a silicon reservoir constructed in this manner is that it is suitable both for continuous and for non-continuous operation with regard to both the introduction of lump-form silicon and the release of molten silicon.

In the actual melting process, the heating energy necessary for melting is advantageously supplied to the lump-form silicon, which is charged into a silicon reservoir or crucible continuously or in portions, for example, by means of a shaking trough. The lump-form silicon is charged in a manner such that, before flowing out, the molten silicon collecting above the outlet opening remains in contact with the next batch of lump-form silicon. In general, it is therefore unnecessary to heat the entire height of the melting crucible, and it is sufficient to heat only a zone covering approximately from one- to two-thirds of the lower area of the crucible. This arrangement ensures that there is a constant supply of material to the melting area, by means of the lump-form silicon in the next batch coming from above and being gradually melted. At the same time, this arrangement also ensures that the molten silicon flows in a uniform manner and substantially independently of the height of the melt. In addition, due to the permanent contact between the molten and solid silicon, a melt is produced that has an especially homogenous temperature and low convection, and from which there can be obtained, e.g., upon controlled solidification, a high quality material with few impurities. Since, in addition, the silicon is in molten form for only a short period, and only a small quantity is melted at any instant, and with negligible superheating, the amount of impurities incorporated as a result of reaction with the vessel wall is also low. The flare angle at which the melting crucible widens from the outlet opening until the desired inside width is reached, is advantageously from 30° to 180°, preferably from 60° to 120°. Other forms of the melting crucible base or lower area, for example, dish-shaped forms, are also possible provided that they allow the lump-form silicon to be fed in and a pool of molten material to be formed. It is also advantageous if the inside diameter of the outlet opening is large enough so that, at most, it allows the amount of molten silicon produced in unit time with maximum heating to flow out in unit time.

The materials suitable for the rollers can, in principle, also be used as the crucible material. It is, however, preferable to use quartz crucibles which are generally surrounded by a supporting crucible made of graphite and, at least in the lower crucible area, also by a heating device.

The melt 5 leaves silicon reservoir 1 in a stream 6 through outlet opening 2 and passes into the crystallization chamber 7 which is formed, for example, by rotatable rollers 8 arranged in the shape of a square.

Also suitable for the preparation of the molten silicon in a reservoir and the transfer into the crystallization chamber, is, for example, the method of metering in from a supply container filled with silicon melt by means of displacement members. In addition, it is possible to use, e.g., a crucible, in which case the molten silicon contained therein is released in a controlled manner by means of a rotatable vertically movable plug bar or stopper rod through a closable opening formed in its base. In this regard, reference is made, for example, to the methods of U.S. Pat. No. 4,312,700, as previously described. Gradual melting of a polycrystalline silicon rod or a rod of compacted silicon granulate by means of an electron beam would also be possible.

In crystallization chamber 7 surrounded laterally in a leak-proof manner by the rollers 8, the molten silicon supplied forms a pool of molten material 9 which forms a layer above the silicon rod 10 which has already solidified. As the crystallization front 11 progresses in the pool of molten material, starting from rollers 8, which are preferably cooled, and the already solidified silicon rod 10, silicon rod 10 is moved downwardly so that the newly formed solidified silicon is conveyed out of crystallization chamber 7 while fresh molten silicon is added above from silicon reservoir 1. The roller can be cooled, for example, by a cooling medium, such as, e.g., argon, which flows through cooling ducts 12. The rod is preferably withdrawn in the vertical direction at the bottom although, in principle, directions other than the vertical are not excluded.

In the crystallization process, crystallization front 11 must never sink so far that the melt meniscus, which is being formed in the edge zone between the curved outer surface of the roller and the already solidified silicon and is maintained by the surface tension, is pulled away, allowing the molten silicon to escape. Experience has shown that a width of the meniscus of approximately from 0.5 to 1.5 mm represents the limiting value. It is, however, equally detrimental if crystallization front 11 rises above the narrowest point of the passageway between the rollers, since the silicon rod may then solidify with too large a cross-section, would be impossible to move downwardly, and would inevitably block the rollers.

The amount of molten silicon supplied in unit time and the amount of solidified silicon withdrawn in unit time are therefore preferably coordinated with one another so that the surface of the pool of molten material is maintained with as little deviation as possible, at the level of the narrowest point of the passageway determined by the rollers. Deviations of approximately 5 mm upwardly or downwardly are generally permissible. The height of the pool of molten material, i.e., the distance between the crystallization front and the melt surface, is advantageously maintained at a value of from 0.1 to 5 mm in the edge zone of the rod, while the values towards the inside of the rod may be higher, typically up to approximately half of the lateral length.

The position of the pool of molten material 9 inside of crystallization chamber 7 can be monitored, for example, by means of a pyrometer which is directed onto the desired position of the melt surface on the outer surface of one of the rollers. If the melt sinks, then the temperature at the measuring point also decreases. The measuring signal may be further conveyed, for example, to a pulse generator which reduces the drawing speed at which the solidified material is withdrawn from crystallization chamber 7. In addition, it is also possible, for example, by increasing the heat, to increase the amount of molten material in silicon reservoir 1, and thus the supply of molten silicon, until the intended position of the melt surface is reached again.

If the melt rises above the intended level, then the temperature at the measuring point will rise and the drawing speed can be increased accordingly. Furthermore, the heat in the silicon reservoir can then optionally be reduced and the supply of molten silicon can thus be decreased.

Advantageously, the cooling of the rollers, for example, by passing argon through them, is also designed to be controllable so that, even at high drawing speeds and a great melt height, the molten silicon in the region of contact with the rollers is solidified as fast as possible by intensive cooling. In this manner, it is possible to ensure that the molten silicon, almost immediately after entering crystallization chamber 7, is surrounded by a border of solidified silicon which prevents molten silicon from escaping and at the same time minimizes the contamination of the silicon with impurities from the rollers. The thickness of this rapidly formed border layer can be controlled by the temperature of the rollers. A thickness of as little as from 0.3 to 1.0 mm has generally proved sufficient. In order to be able to influence the formation of the border layer, the temperature of the rollers must of course be kept below the melting temperature of the silicon, preferably in the range of from 1350° to 1410° C. As an additional means of controlling the temperature of the rollers and also, especially in the initial phase, the temperature inside crystallization chamber 7, a heating apparatus 13 is advantageously provided. It is possible to use for this purpose an inductively heated graphite ring, for example, which surrounds crystallization chamber 7 and is insulated at the outside.

It was found that the molten silicon transferred to crystallization chamber 7 had a particularly favorable crystallization behavior if stream 6 did not impinge on the same area of the pool of molten material 9 throughout the entire pouring operation. The molten silicon is therefore preferably transferred into crystallization chamber 7 in a stream the direction of which can be varied. As a result, the stream can be directed into different areas of the surface of the pool of molten material 9 and can thus compensate, for example, for irregularities in the solidification front and a non-uniform temperature distribution in the pool of molten material 9, especially in the edge and corner zones. Thus, the zone of impact can be directed over the surface of the pool of molten material 9, for example, in a path that is directed radially into the corners, in a circular path, or in a path which runs from corner to corner in an arc.

In a preferred embodiment of the invention, the temperature of the surface of the pool of molten material 9 is monitored by means of suitable measuring devices, for example, a diode array, and the molten stream is directed by means of a control device onto whichever area is the coldest.

The stream can be directed onto the desired area of the pool of molten material 9, for example, by pivoting or displacing silicon reservoir 1. It is also possible to use a member that is introduced into the stream 6 and permits changes in direction, e.g., a pivotable or displaceable funnel. Although it is also possible in principle to displace the entire crystallization chamber 7 relative to stream 6, this involves considerable expenditure in terms of apparatus.

With the process according to the invention, it is generally possible to achieve drawing speeds of from 0.1 to 30 mm/min., preferably from 0.5 to 5 mm/min. When setting or changing the drawing speed, care should be taken that the silicon leaving crystallization chamber 7 is not released by rollers 8 until at least a stable solidified outer shell has formed making it impossible for molten silicon to escape.

Advantageously, silicon rod 10 leaving crystallization chamber 7 is additionally cooled by a cooling device 14. For this purpose, it is possible to use, for example, a set of ring nozzles which are arranged around the rod and from which an inert cooling gas, e.g., argon, is blown against the rod. The cooling coils or bodies, which surround the rod and which are made, for example, of refined steel, preferably have a suitable cooling medium, especially water, passing through them. The cooling is advantageously adjusted so that the silicon rod, at a distance of approximately from 30 to 40 cm from the crystallization front, has a temperature of approximately from 700° to 800° C. The mean temperature gradient along this section should be approximately from 5° to 30° C./cm. Experience has shown that, from a temperature of from approximately 600° to 700° C., when the material is below the plastic range, further cooling does not present any difficulty.

The downward movement of silicon rod 10 is effected by a support 15 which is advantageously cooled from below, for example, by a cooling agent that passes through it. Support 15 can be moved up or down, preferably vertically, for example, by means of an adjustable (e.g., electrical or hydraulic) drive, thereby determining the drawing. The connection between silicon rod 10 and support 15 can be produced, for example, by means of a silicon core 16 which is received in a recess in the support and is secured, for example, by a bolt and can be removed together with the resulting silicon rod when the drawing operation has been completed.

A new silicon core 16, which is advantageously surrounded by a receptacle 17, preferably made of quartz material, and favorably projects into this receptacle by approximately from 5 to 20 mm, can then be fastened in support 15 for the next drawing operation. The support is then moved upwardly, advantageously until the side walls of receptacle 17 come into contact with the rollers, and molten silicon can again be transferred from the silicon reservoir into the crystallization chamber. The molten silicon initially surrounding silicon core 16 is firmly joined to the latter on solidifying and thus forms a stable connection between the silicon rod and the support.

It is, however, also possible to start the drawing operation, for example, by moving a seed crystal plate that is of an appropriate size and is firmly connected to the support 15, towards crystallization chamber 7 until the latter is tightly closed at the base. The molten silicon is then supplied from silicon reservoir 1 and is joined to the seed crystal plate on solidifying.

When the desired rod length, typically approximately from 200 to 1000 mm, has been obtained, the silicon supply is interrupted, unless an appropriate amount of silicon was initially provided, and the rod obtained can be removed. Support 15 is then prepared for a further drawing operation and moved towards crystallization chamber 7 again.

In another embodiment of the invention, instead of a semicontinuous process as previously described, a quasi endless column is drawn from the crystallization chamber in a continuous drawing operation. Individual rods or sections of the desired length can then be separated or prepared from the column. For this purpose, it is possible, for example, by introducing separating plates from time to time into the crystallization chamber, to provide predetermined breaking points in the resulting column at a desired distance from one another, at which the column can then be broken, for example, by breaking off or sawing.

Types of silicon available commercially or customarily used in solar technology are, in principle, suitable for the process according to the invention, provided that they satisfy the purity requirements of the desired product. If the material used has not been doped or if the doping substance content deviates from the desired doping of the product, it is possible, for example, to add to the silicon reservoir the required amount of doping substance. In the case of solar cell base material, boron or phosphorus is preferred although, in principle, other doping substances, such as, for example, aluminum, gallium, indium, arsenic or antimony are also suitable. Optionally, the doping substance can also be supplied by means of a gas stream that is conveyed over the pool of molten material 9 and contains a decomposable volatile compound of the doping substance, such as, for example, hydrogen boride or hydrogen phosphide.

The entire arrangement is accommodated in a gastight container (not shown), which is advantageously made of refined steel, in order to be able to obtain a working atmosphere that is inert towards silicon. It has proved advantageous to use inert gases, such as helium, hydrogen or, preferably argon, advantageously in a range of from 1 to 100 mbar.

The silicon rods obtainable according to the process of the invention and having a columnar structure comprising monocrystalline crystal zones with a crystallographic preferred orientation, can be separated in a customary manner into wafers which are then further processed to form solar cells. The resulting wafers are distinguished by a particularly low content of impurities, especially carbon and oxygen.

The process is described in more detail below by way of the following example, which is given by way of illustration and not of limitation.

EXAMPLE

The process was carried out in an arrangement corresponding to FIG. 1, except that cooling device 14 was omitted. The apparatus was accommodated in a vacuum-tight container (height approximately 800 mm, diameter approximately 400 mm) in which, after previous evacuation, an argon atmosphere with a pressure of approximately 10 mbar (throughput rate approximately 500 liters argon/hour) was established.

A quartz crucible (height 480 mm, diameter 200 mm, wall thickness 5 mm) was held by a supporting crucible made of graphite and used as the silicon reservoir. It was possible to heat the lower third of the quartz crucible by means of an inductively heated graphite tube which surrounded the crucible and was insulated at the outside. The crucible tapered in the form of a funnel at the bottom and ended in an outlet opening having a diameter of approximately 1 mm.

Using two drive members operating at right-angles to one another, it was possible to move the crucible in its horizontal plane, as desired.

The crystallization chamber was arranged in the container at a height of approximately 300 mm. It comprised four rollers which were 110 mm in length and 100 mm in diameter, and arranged in a square. The rollers were made of graphite that had been rendered inert towards molten silicon by impregnation and compression. The rollers were at a distance of approximately 0.2 mm from one another at the corners and could therefore be rotated freely and independently of one another. The rollers overlapped one another at the corners by approximately 2 mm, i.e., the square passageway they surrounded had an edge length of approximately 108 mm. It was possible to pass an argon stream, which could be regulated by means of a metering valve, through ducts in the rollers and thereby cool the rollers. It was also possible to heat the crystallization chamber with the rollers by means of an inductively heatable graphite tube (height approximately 120 mm) which surrounded the chamber and was insulated at the outside.

A receptacle made of quartz material and having a lateral height of 20 mm was placed on a support, comprising a square graphite base (108 mm edge length), and having the same cross-section as the receptacle. A silicon core in the shape of a round rod (length 150 mm, diameter 12 mm) was fastened by means of bolts into a tightly fitting recess in the base. The core projected approximately 15 mm into the receptacle through the base of the receptacle, and was moved from below towards the crystallization chamber by means of a water-cooled vertically movable shaft, until the walls of the receptacle touched the rollers.

The silicon reservoir was filled with 4 kg of lump-form silicon and was heated. The silicon gradually began to melt and flow in a thin stream through the outlet opening and into the crystallization chamber. When the silicon started to flow, the silicon reservoir was moved out of its central starting position and displaced in a circular path from which the stream was directed in the form of an arc from corner to corner of the crystallization chamber.

While the receptacle of quartz material was thus gradually filled with molten silicon, the temperature of the rollers, measured by pyrometers, increased to approximately 1400° C. and was maintained at this value with the aid of the crystallization chamber heating system and a variable argon stream conveyed through the rollers (throughput rate approximately from 20 to 300 liters/hour). The silicon core also began to melt at the surface under the effect of the surrounding melt so that when the melt solidified again, a firm connection with the support was produced.

When the surface of the melt had risen approximately 2 mm above the narrowest point of the passageway formed by the rollers, the support was lowered at an average speed of approximately 3 mm/min. As a result, the amount of solidified silicon removed from the crystallization chamber per unit time corresponded substantially to the amount of silicon flowing in from the silicon reservoir.

During the drawing operation, the surface of the melt was always held in the range of approximately from 2 mm above to 2 mm below the narrowest point of the passageway, by varying the drawing speed and optionally by the cooling of the rollers. The molten silicon coming into contact with the cooled rollers solidified immediately, forming a stable outer shell approximately from 0.3 to 1 mm thick, while towards the inside, crystallization took place at a distinctly slower rate. Therefore, a dish-shaped crystallization front with a pool of molten material having a maximum depth of approximately 30 mm ultimately resulted.

When the silicon reservoir had emptied, the heating of the crystallization chamber was at first increased for a short period to prevent the melt surface from solidifying prematurely and enclosing the molten material, and it was then slowly reduced for the complete solidification of the silicon. The resulting rod, measuring $108 \times 108 \times 250$ mm$^3$, was cooled to approximately 500° C. and finally removed. It had a columnar structure comprising monocrystalline crystal zones with a crystallographic preferred orientation.

After separating an edge zone approximately 4 mm thick, the rod was sawed into square wafers ($100 \times 100$ mm, 400 $\mu$m thick). The average carbon content of these wafers was $0.8 \times 10^{17}$ carbon atoms per cm$^3$ and the oxygen content was approximately $2.4 \times 10^{17}$ oxygen atoms per cm$^3$.

Thus, while only a single embodiment and example of the present invention has been illustrated and described, it will be obvious that many changes and modifications may be made thereunto, without departing from the spirit and scope of the invention.

What is claimed is:

1. In a process for the manufacture of silicon rods suitable as solar cell base material including the steps of supplying molten silicon from a silicon reservoir to a crystallization chamber, effecting controlled solidification of the silicon while maintaining a supernatant pool of molten material, the solidified silicon being supported by a downwardly movable support and being withdrawn by a movement of said support, the improvement comprising the steps of:
    transferring said molten silicon to a crystallization chamber in which the pool of molten silicon is surrounded in a leak-proof manner by at least three rollers arranged to define the outer perimeter of a rod and which are rotatable freely and independently from one another in the withdrawal direction, and made, at least on the surface thereof that comes into contact with molten silicon, of material that is substantially inert towards molten silicon; and
    withdrawing the solidifying silicon from said rollers only after at least a stable solidified outer shell has been formed to thereby produce a silicon rod having a columnar structure comprising monocrystalline crystal zones with a crystallographic preferred orientation.

2. The process according to claim 1, wherein said rollers from a passageway having a narrowest point, and wherein said process further comprises the step of coordinating the amount of molten silicon supplied and the amount of solidifying silicon withdrawn, so that the surface of the pool of molten silicon is maintained in a range of up to 5 mm above or below the narrowest point of the passageway formed by the rollers.

3. The process according to claim 1, wherein the transferring of said molten silicon into the crystallization chamber is carried out by means of a stream having a variable direction.

4. The process according to claim 3, wherein the stream of molten silicon is directed to the coolest partial areas of the pool of molten material.

5. The process according to claim 1, further comprising the step of producing molten silicon in a melting crucible that is charged with lump-form material and is tapered to form a funnel-shaped outlet at its bottom.

6. The process according to claim 1, further comprising the step of cooling the solidifying silicon as it is withdrawn from said rollers.

7. The process according to claim 1, wherein the downwardly movable support includes a silicon portion that is fixed in the support, connects the support and solidified silicon, and projects into the pool of molten silicon at the beginning of the process.

8. The process according to claim 1, further comprising the step of maintaining the rollers at a temperature of from 1200° to 1410° C.

9. The process according to claim 1 where said molten silicon is prepared according to the steps of:
    charging a melting crucible having a funnel-shaped lower section including an outlet opening, with silicon in lump-form; and
    gradually melting the lump-form silicon such that molten silicon collects in the crucible above the outlet opening and remains in contact with yet unmelted lump-form silicon before flowing out of the outlet opening.

10. The process according to claim 1, further comprising the steps of:
    maintaining a level of the melt surface inside the crystallization chamber by measuring the temperature corresponding to this level on the outer surface of one of the rollers; and
    increasing or decreasing the drawing speed at which the solidifying material is withdrawn as this temperature rises or falls, respectively.

11. The process according to claim 1, wherein said rollers are arranged to produce a prismatic cross sectional shape.

12. The process according to claim 1, wherein said rollers are arranged to produce a polygonal cross sectional shape.

13. The process according to claim 1, wherein said rollers are arranged to produce a retangular cross sectional shape.

14. The process according to claim 1, wherein said rollers are arranged to produce a square cross sectional shape.

15. The process according to claim 1, wherein said withdrawing step occurs at a speed of from 0.1 to 30 mm/min.

16. A process set forth in claim 1, further including an step of removing the edge zone of the outer perimeter of said rod.

17. A process as set forth in claim 16, further including cutting said rod in a direction perpendicular to the longitudinal extent thereof into wafers having a cross-section defined by said outer perimeter.

18. An apparatus for the manufacture of silicon rods suitable for solar cell base material having columar structure comprising monocrystalline crystal zones with a crystallographic preferred orientation comprising:
- a reservoir means for holding and discharging molten silicon;
- a crystallization chamber of receiving molten silicon from said reservoir means;
- at least three rotatable rollers made, at least on their outer surfaces, of a material that is inert towards molten silicon, said rollers being rotatable freely and independently from one another and surrounding said crystallization chamber in a leak-proof manner and defining a passageway corresponding to a rod cross section; and
- a downwardly movable support associated with said rollers and crystallization chamber, having a support surface at least as large as the rod cross section.

19. The apparatus according to claim 18, wherein said reservoir has a funnel-shaped lower portion which ends in an outlet opening.

20. The apparatus according to claim 18, wherein said reservoir includes means for heating and melting silicon.

21. The apparatus according to claim 18, further comprising means for cooling said rollers.

22. The apparatus according to claim 18, wherein said rollers are from 50 to 200 mm in diameter.

23. The apparatus according to claim 18, wherein said rollers are made at least in part of a member selected from the group consisting of graphite which has been rendered inert, glassy carbon, quartz, reaction bonded silicon nitride, reaction bonded silicon carbide, hot-pressed silicon nitride, hot pressed silicon carbide, and a combination thereof.

* * * * *